(12) United States Patent
Iwamoto et al.

(10) Patent No.: US 7,906,981 B1
(45) Date of Patent: Mar. 15, 2011

(54) TEST APPARATUS AND TEST METHOD

(75) Inventors: Satoshi Iwamoto, Saitama (JP); Koichi Yatsuka, Gunma (JP)

(73) Assignee: Advantest Corporation, Tokyo (JP)

( * ) Notice: Subject to any disclaimer, the term of this patent is extended or adjusted under 35 U.S.C. 154(b) by 20 days.

(21) Appl. No.: 12/557,483

(22) Filed: Sep. 10, 2009

(51) Int. Cl.
  *G01R 31/02* (2006.01)
(52) U.S. Cl. .................................. 324/762.01
(58) Field of Classification Search .......... None
  See application file for complete search history.

(56) References Cited

U.S. PATENT DOCUMENTS

| 6,363,507 B1 | 3/2002 | Truebenbach et al. |
| 2004/0239310 A1 | 12/2004 | Oshima et al. |

FOREIGN PATENT DOCUMENTS

| JP | 2002-90421 A | 3/2002 |
| JP | 2002-528706 A | 9/2002 |
| JP | 2007-52028 A | 3/2007 |
| WO | 03/062843 A1 | 7/2003 |
| WO | 2004/072670 A1 | 8/2004 |

OTHER PUBLICATIONS

The explanation of circumstances concerning the accelerated examination dated Sep. 2, 2010, in a counterpart Japanese patent application JP2010-196955 submitted to Japanese patent Office. Concise Explanation of Relevance: This document cites Foreign Patent document Nos. 1-2 listed above.
Evans, "The New ATE: Protocol Aware", Test Conference, IEEE International, Oct. 2007, pp. 1-10, Santa Clara, CA.

*Primary Examiner* — Ha Tran T Nguyen
*Assistant Examiner* — Roberto Velez
(74) *Attorney, Agent, or Firm* — Chen Yoshimura LLP (57) ABSTRACT

There is provided a test apparatus for testing a device under test, including: a plurality of test sections; and a first synchronization section and a second synchronization section that, for each of a plurality of domains that respectively include one or more of the plurality of test sections, synchronize the one or more test sections included in the domain, where each of the first synchronization section and the second synchronization section includes: a local collection section that collects, for each domain, synchronization requests from the test sections connected to the corresponding synchronization section; an exchange section that exchanges, for a discrete domain of that includes test sections connected to the first synchronization section and test sections connected to the second synchronization section, synchronization requests collected in the corresponding synchronization section with synchronization requests collected in the other synchronization section; a global collection section that collects, the synchronization requests collected in the corresponding synchronization section and the synchronization requests collected in the other synchronization section; and a distribution section that distributes the collected synchronization requests to each of the test sections connected to the corresponding synchronization section.

7 Claims, 7 Drawing Sheets

TEST APPARATUS AND TEST METHOD

BACKGROUND

1. Technical Field

The present invention relates to a test apparatus and a test method.

2. Related Art

One known apparatus for testing a device under test such as a semiconductor chip is equipped with a plurality of test circuits. In this case, it is desirable to synchronize the operation of the plurality of test circuits.

Some examples of such a test apparatus are disclosed in WO No. 2003/062843 and Japanese Patent Application Publication No. 2007-52028.

The plurality of test circuits of such a test apparatus operate according to a program or a sequence which are given in advance. The test apparatus synchronizes the operation of the test circuits by synchronization of the start/stop of the execution of such programs.

However, when performing various types of tests, simply synchronizing the execution start of the program in each test circuit is not often enough. For example, there may be cases where it is required to execute the next step in synchronization, on condition that a failure has been detected in a predetermined test circuit. If the size of the test apparatus becomes large in such cases, the synchronization circuit that collects and distributes synchronization signals becomes accordingly large, thereby making the implementation difficult.

SUMMARY

Therefore, it is an object of an aspect of the innovations herein to provide a test apparatus and a test method, which are capable of overcoming the above drawbacks accompanying the related art. The above and other objects can be achieved by combinations described in the independent claims. The dependent claims define further advantageous and exemplary combinations of the innovations herein.

According to an aspect related to the innovations herein, one exemplary test apparatus for testing at least one device under test, including: a plurality of test sections that test the at least one device under test via a plurality of terminals: and a first synchronization section and a second synchronization section that, for each of a plurality of domains that respectively include one or more of the plurality of test sections, synchronize the one or more test sections included in the domain, where each of the first synchronization section and the second synchronization section includes: a local collection section that collects, for each domain, synchronization requests from test sections from among the plurality of test sections connected to the corresponding synchronization section; an exchange section that exchanges, for a discrete domain of the plurality of domains that includes test sections connected to the first synchronization section and test sections connected to the second synchronization section, synchronization requests collected in the corresponding synchronization section with synchronization requests collected in the other synchronization section; a global collection section that collects, for the discrete domain, the synchronization requests collected in the corresponding synchronization section and the synchronization requests collected in the other synchronization section; and a distribution section that distributes, to each of the test sections connected to the corresponding synchronization section, synchronization requests collected for a domain including the test section. In addition, a test method corresponding to the test apparatus is provided.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention. The same or similar elements may occasionally be provided with the same reference numeral, with the related description thereof omitted.

Figure 1:
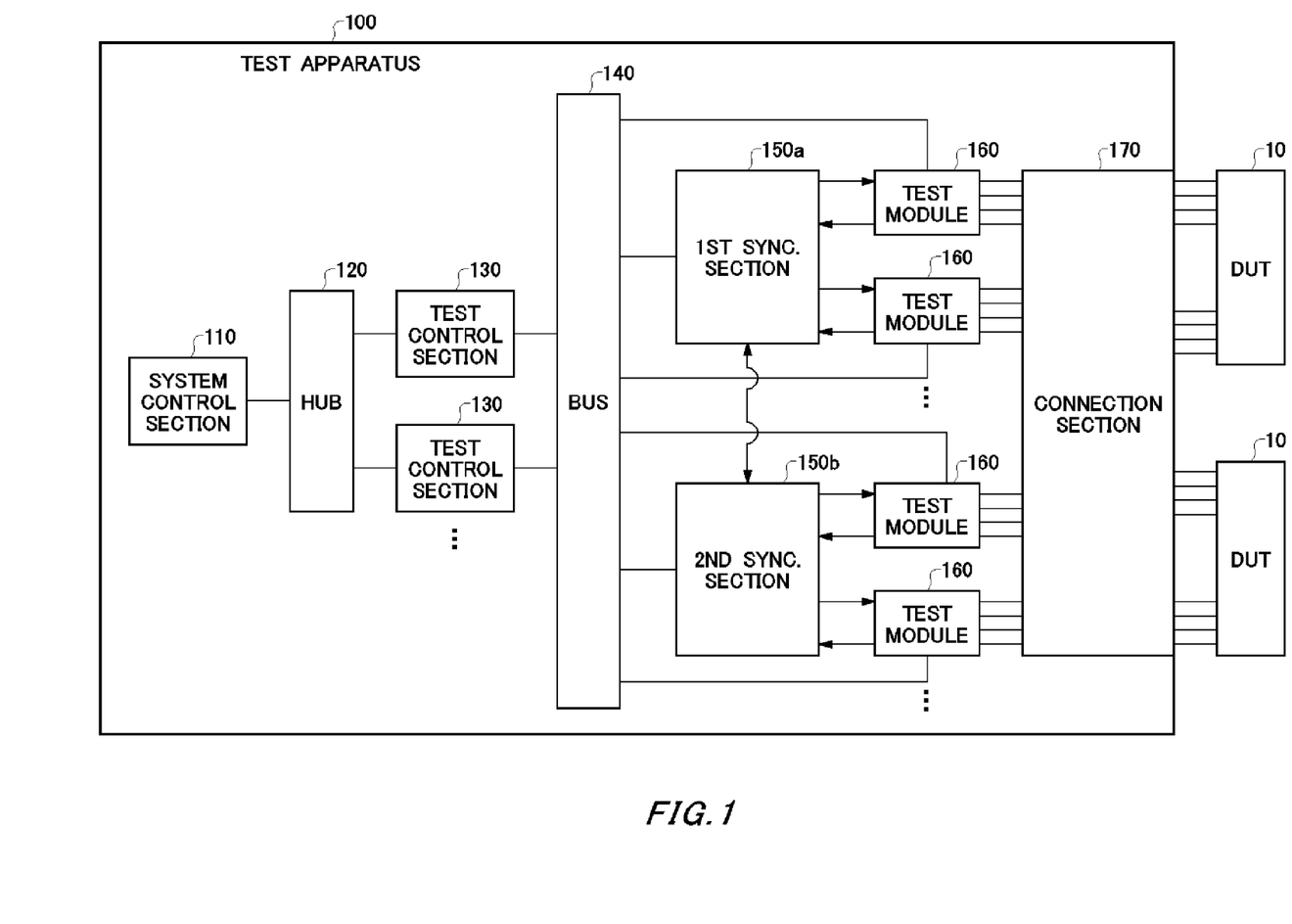
FIG. 1 shows a configuration example of a test apparatus 100 according to the present embodiment, together with a DUT 10.

FIG. 1 shows a configuration example of a test apparatus 100 according to the present embodiment, together with a DUT 10. The test apparatus 100 tests at least one DUT (device under test) 10 such as an analog circuit, a digital circuit, a memory, and a system on chip (SOC). The test apparatus 100 of the present example tests the DUT 10 by synchronizing the operation of a plurality of test modules 160 at an intended timing. The test apparatus 100 also tests the DUT 10 by synchronizing the operation of a test module 160 at an arbitrary timing using a plurality of synchronization sections 150.

The test apparatus 100 may test a plurality of DUTs 10 independently from each other, or test the plurality of DUTs 10 in parallel to each other. The test apparatus 100 includes a system control section 110, a hub 120, test control sections 130, a bus 140, a synchronization section 150, a test module 160, and a connection section 170.

The system control section 110 controls the entire test apparatus 100. For example, the system control section 110 may control the test control sections 130, the synchronization section 150, and the test module 160, according to a program or an instruction given by a user or the like. More specifically, the system control section 110 may generate a reference clock that defines the operation period of the test control section 130, the synchronization section 150, and the test module 160, and may generate a control instruction for controlling the operation of the test control sections 130. The system control section 110 may transmit a control instruction and/or a program adapted to a test, to a corresponding test control section 130 via the hub 120.

The hub 120 electrically connects the system control section 110 with at least one test control section 130. The hub 120 may relay using a general or dedicated high-speed serial bus or the like. Some examples of the general high-speed serial bus are Ethernet (registered trademark), USB, and Serial RapidIO.

The test control section 130 controls the synchronization section 150 and the test module 160, to perform a test. The test control section 130 may control the synchronization section 150 and the test module 160, according to a control instruction and/or a program given by the system control section 110. More specifically, the test control section 130 may generate a control instruction for controlling the operation of the synchronization section 150 and the test module 160, depending on the particular test. There may be a plurality of test control sections 130 in the test apparatus 100, depending on the purpose of each test directed to a respective DUT 10, where each test control section 130 may perform a plurality of tests independent from one another.

A test control section 130 may exchange data with at least two synchronization sections 150 and at least one test module 160 via the bus 140. A test control section 130 may store, in advance in its test module 160, a predetermined test program, a data pattern adapted to each test.

The bus 140 electrically connects between the test control section 130, the synchronization section 150, and the test module 160. The bus 140 may set the connection between the synchronization section 150 and the test module 160 adapted to each test, so as to perform a plurality of tests using the appropriate number of modules. The bus 140 may use a plurality of bus switches for switching the connection between the synchronization section 150 and the test module 160 for each test.

The synchronization section 150 is connected to a plurality of test modules 160, receives a synchronization request from at least one test module 160 connected to the synchronization section 150, and transmits a synchronization request to a test module 160 to be synchronized. There may be two or more synchronization sections 150 in the test apparatus 100, each of which is synchronized in a master/slave relation. Each synchronization section 150 may directly exchange signals used for synchronization. A synchronization section 150 may be a synchronization module mounted on a module connector of a test head, together with a test module 160.

A test module 160 may test a DUT 10 based on a control signal of the test control section 130. The test modules 160 may be a plurality of types of modules adapted to respective test items to be executed, each of which may be included in the test apparatus 100 according to an intended test item. Each test module 160 may be attached removable to the test apparatus 100, and the number and the type of the test modules 160 connected to the test apparatus 100 may be adapted to each particular test. A test module 160 exchanges test signals with the DUT 10 via the connection section 170.

Figure 2:
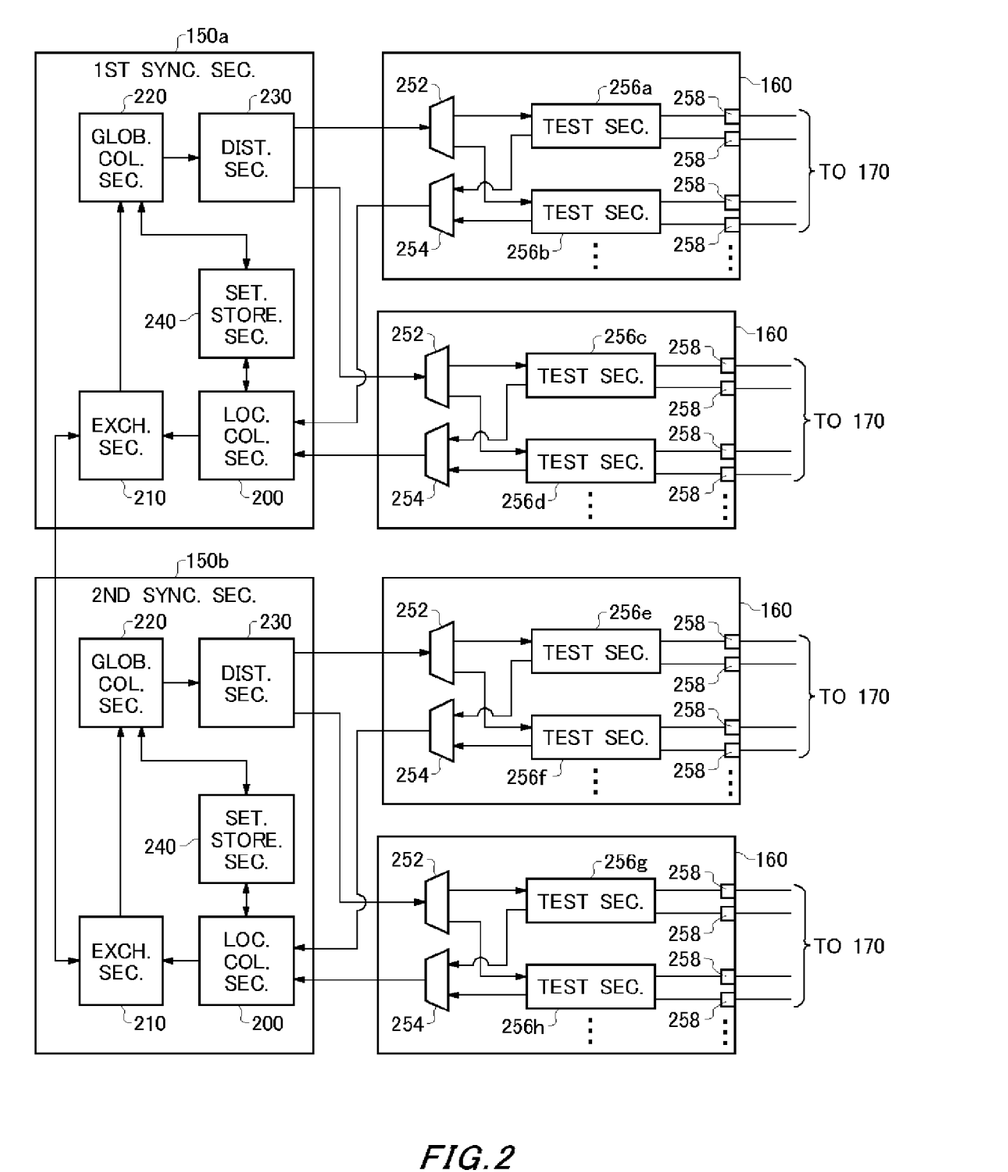
FIG. 2 shows a configuration example of a first synchronization section 150a, a second synchronization section 150b, and four test modules 160 of a test apparatus 100 according to the present embodiment.

FIG. 2 shows a configuration example of a first synchronization section 150a, a second synchronization section 150b, and four test modules 160 of the test apparatus 100 according to the present embodiment. In the present example, two synchronization sections 150 and four test modules 160 are included in the test apparatus 100, and the collection and the distribution of synchronization requests in this example are detailed below.

Each test module 160 includes two or more test sections 256, to multiplex and transmit synchronization requests from the two or more test sections 256 respectively. Here, for each test of the test sections 256, each synchronization request may be transmitted when there is a failure, when a test is started, and/or when a test is ended. A test module 160 includes a demultiplexer 252, a multiplexer 254, a test section 256, and a terminal 258. The demultiplexer 252 receives a synchronization request from the synchronization section 150, and transmits a synchronization request to a corresponding test section 256.

A test section 256 tests at least a part of the interface of at least one DUT 10, via a plurality of terminals 258. A test section 256 tests a DUT 10 by operating according to a given test program. For example, the test section 256 sequentially executes respective instructions included in the given test program, to execute the operation adapted to each instruction. For example, a test program may include a sequence according to which a plurality of data patterns given in advance are outputted. The test section 256 may include a sequencer to sequentially output the data patterns according to the sequence.

The data pattern may be a bit unit pattern that designates a logical value to be applied to each pin of a DUT 10 bit by bit, and may also be a plurality of bit unit patterns that designate a logical value to be applied to each pin of a DUT 10 in a unit of a plurality of bits. Also, for pursuing a special test function, the data pattern may be a packet unit pattern that collectively designates a logical value to be applied to each pin of a DUT 10 for a plurality of bits.

The test section 256 may also judge acceptability of a DUT 10 by comparing a signal received from a DUT 10 with an expected value. The test section 256 generates the expected value in a similar way in which the pattern to be given to the DUT 10 is generated.

Each test section 256 may execute an individual test based on each test program. Instead, two or more test sections 256 may execute a single test onto one or more DUTs 10 by synchronizing the operation based on a test program. In this case, the two or more test sections 256 may be setd in advance as a domain whose operation is synchronized when the test apparatus 100 executes a predetermined test.

The test section 256 may start testing the DUT 10 in response to reception of a synchronization request from the synchronization section 150. In response to ending of a predetermined test, the test section 256 may transmit a synchronization request to the multiplexer 254. In this case, the test section 256 may halt (or bring to idling state) the operation until the next synchronization request is received from the synchronization section 150. The multiplexer 254 multiplexes the synchronization signal from a test section 256 connected thereto, and transmits the multiplexed synchronization signal to the synchronization section 150.

The first synchronization section 150a and the second synchronization section 150b, for each of a plurality of domains respectively including one or more of the plurality of test sections 256, synchronize the test sections 256 in the domain. In pursuing one test item, the test apparatus 100 may set at least one test section 256 as a domain. In this case, the synchronization section 150 may pursue synchronization per domain.

The domain set by the test apparatus 100 may also include test sections 256 in the test modules 160 not directly connected to the synchronization section 150. For example, the test apparatus 100 may include, in one domain, the test section 256a, the test section 256b, and the test section 256e. In the present embodiment, a domain containing two or more test sections 256 connected to different synchronization sections 150 is referred to as a discrete domain. Accordingly, each of the first synchronization section 150a and the second synchronization section 150b may set, as a discrete domain, a part of two or more domains configurable in the corresponding synchronization section.

The first synchronization section 150a and the second synchronization section 150b may synchronize the plurality of test sections 256 connected thereto, per domain. Each of the first synchronization section 150a and the second synchronization section 150b includes a local collection section 200, an exchanges section 210, a global collection section 220, a distribution section 230, and a setting storage section 240. The local collection section 200 collects, for each domain, the synchronization requests from the test section(s) 256 among the plurality of test sections 256 that is(are) connected to the synchronization section 150. For example, the local collection section 200 within the synchronization section 150a transmits the synchronization requests collected for each domain from the test sections 256a-256d, to the exchange section 210.

For a discrete domain containing the test section(s) 256 connected to the first synchronization section 150a and the test section(s) 256 connected to the second synchronization section 150b, the exchange section 210 of the first synchronization section 150a exchanges the synchronization requests collected in the synchronization section 150a, with the synchronization requests collected in the synchronization section 150b. To be more concrete, the exchange section 210 of the first synchronization section 150a selects the synchronization requests for a discrete domain, from all the synchronization requests collected in the first synchronization section 150a, and transmits the selected synchronization requests for the discrete domain to the second synchronization section 150b, and receives, from the second synchronization section 150b, the synchronization requests collected in the second synchronization section 150b for the discrete domain. The exchange section 210 transmits the synchronization requests for the domains and the synchronization requests for the discrete domains, to the global collection section 220.

The global collection section 220 collects, for a discrete domain, the synchronization requests collected in the first synchronization section 150a and the synchronization requests collected in the second synchronization section 150b. The global collection section 220 transmits all the synchronization requests collected for either the domains or the discrete domains to the distribution section 230. To each of the test sections 256 connected to the synchronization section 150a, the distribution section 230 of the synchronization section 150a distributes the synchronization requests collected for the domain including the test sections 256 connected to the synchronization section 150a.

The setting storage section 240 stores the setting of a discrete domain that is included in two or more domains configurable in the synchronization section 150. The setting storage section 240 may store, either as a domain or a discrete domain, various combinations of the test sections 256. The local collection section 200 and the global collection section 220 may collect the synchronization requests based on the information on the domains stored in the setting storage section 240.

As stated above, even when a domain involves two or more synchronization sections 150, a synchronization section 150 can synchronize the operation of the test sections 256 for each domain. The test control section 130 may designate a combination of the test sections 256, or each test section 256 may designate the combination of the test sections 256 according to the test program given by the test control section 130.

Figure 3:
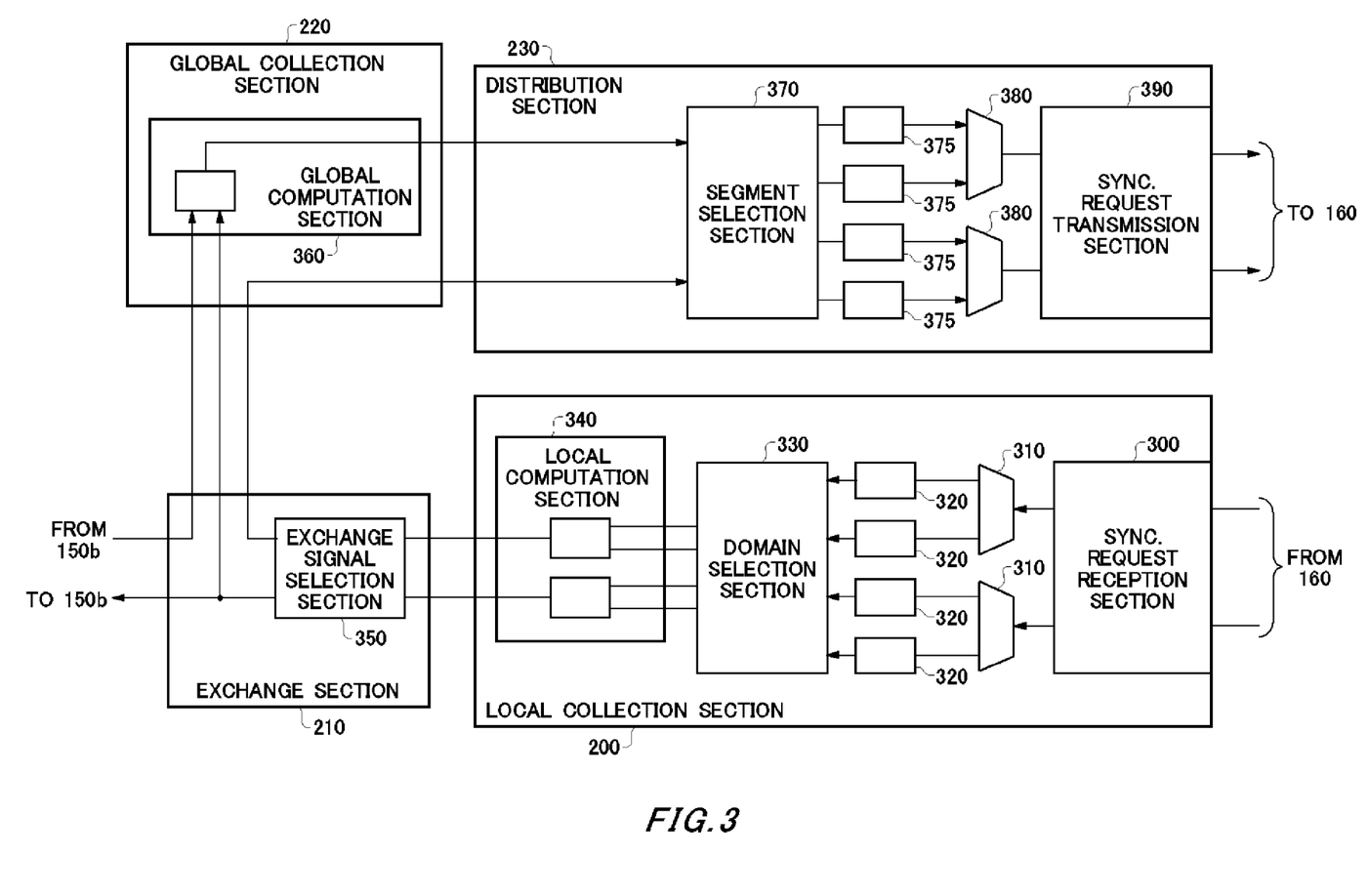
FIG. 3 shows a configuration example of a local collection section 200, an exchange section 210, a global collection section 220, and a distribution section 230 of a first synchronization section 150a according to the present embodiment.

FIG. 3 shows a configuration example of a local collection section 200, an exchange section 210, a global collection section 220, and a distribution section 230 of the first synchronization section 150a according to the present embodiment. Here, the second synchronization section 150b has the same configuration as the first synchronization section 150a, and so the explanation thereof is omitted below. The local collection section 200 includes a synchronization request reception section 300, a demultiplexing section 310, collection-section segments 320, a domain selection section 330, and a local computation section 340.

The synchronization request reception section 300 is connected to each test module 160. Each test module 160 multiplexes the synchronization request from each test section 256 of itself, and transmits the synchronization request to the synchronization request reception section 300. The synchronization request reception section 300 transmits the received synchronization request to the demultiplexing section 310.

The demultiplexing section 310 demultiplexes the synchronization request multiplexed by the test module 160, and outputs the synchronization request from each test section 256 within the test module 160. Since the demultiplexing section 310 outputs a synchronization request from each test section 256 to a corresponding signal line, the synchronization request outputted to each signal line from the demultiplexing section 310 is treated as a synchronization request for each segment 320 which is the minimum unit of the synchronization request, and so matches the synchronization request outputted from each test section 256.

The domain selection section 330 collects a plurality of collection-section segments 320 outputted from the demultiplexing section 310 for each domain, and transmits the collected collection-section segments 320 to the local computation section 340. The domain selection section 330 may collect the plurality of collection-section segments 320 for each domain, based on the information on the domains stored in the setting storage section 240. An example of the information on the domains is a bit map indicating, for each domain, whether each segment 320 belongs to the domain.

The local computation section 340 computes, for each domain, the synchronization requests in a unit of a plurality of segments 320 collected for the domain. For example, each of the local computation sections 340 of the first synchronization section 150a and of the second synchronization section 150b may collect the synchronization requests for the test sections 256 in a domain using the AND condition and the OR condition according to the setting. The local computation section 340 transmits the synchronization requests collected for each domain, to the exchange section 210.

Here, for example when the local computation section 340 performs the collection using the AND condition, the local computation section 340 transmits a synchronization request to the exchange section 210 in response to transmission of the synchronization requests by all the test sections 256 within the domain. This example may be used, for example, when it is desirable to transmit a synchronization request in response to ending of all the tests of the test sections 256 in a domain, so as to execute the next test item.

In another example where the local computation section 340 performs the collection using the OR condition, the local computation section 340 transmits a synchronization request to the exchange section 210 in response to transmission of the synchronization requests by one or more of the test sections 256 within the domain. This example may be used, for example, when it is desirable to transmit a synchronization request in response to failure of even a single test of the test sections 256 in a domain, so as to perform the next test item.

The exchange section 210 includes an exchange signal selection section 350. The exchange signal selection section 350 receives, from the local computation section 340, the synchronization requests collected for each domain, and selects the synchronization requests in a discrete domain as an exchange signal. The exchange signal selection section 350 may select an exchange signal based on the information of the discrete domain stored in the setting storage section 240. An example of the information on discrete domains is a bit map indicating, for each domain, whether each segment 320 belongs to the domain. For example, for a discrete domain, if a test section 256 constituting the discrete domain exists in the test module 160 connected to the second synchronization section 150b, the exchange signal selection section 350 selects a synchronization request for the discrete domain as an exchange signal.

The exchange section 210 divides the selected exchange signal, to transmit a half of the selected exchange signal to the second synchronization section 150b. The exchange section 210 transmits the other half of the selected exchange signal to the global collection section 220, together with the synchronization request for the domains other than the discrete domain not selected by the exchange signal selection section 350. Here, the exchange section 210 also transmits an exchange signal received from the second synchronization section 150b to the global collection section 220.

The global collection section 220 includes a global computation section 360. The global computation section 360 collects the synchronization requests collected in the second synchronization section 150b and the synchronization requests collected in the first synchronization section 150a, using the AND condition and the OR condition according to the setting. For example, the global collection section 220 may set all the computation to the AND condition, to match with the computation of the local computation section 340, or may set all the computation to the OR condition. By doing so, the synchronization requests for the plurality of test sections 256 respectively connected to the first synchronization section 150a and to the second synchronization section 150b constituting a discrete domain can be collected in the first synchronization section 150a and the second synchronization section 150b respectively.

The global collection section 220 may adjust the timings of the synchronization requests collected in the first synchronization section 150a and of the synchronization requests collected in the second synchronization section 150b, to collect, at the same timing, the synchronization requests occurring at the same timing from the test sections 256 included in a discrete domain. By doing so, in response to a synchronization request notification from each test section 256, the synchronization section 150 can synchronize each test section 256 at the same cycle. The global collection section 220 transmits the synchronization requests collected for the domains and the discrete domains to the distribution section 230.

The distribution section 230 includes a segment selection section 370, distribution-section segments 375, a multiplexing section 380, and a synchronization request transmission section 390. The segment selection section 370 may receive the synchronization requests collected for each domain and a discrete domain transmitted from the global collection section 220, select the distribution-section segments 375 corresponding to the test modules 160, and output the synchronization requests to the test modules 160. In this case, the segment selection section 370 may output the synchronization requests to the segments 375 corresponding to all the test modules 160, or instead, may output the synchronization requests to the segments 375 corresponding to predetermined test modules 160. The segment selection section 370 may select the distribution-section segments 375 based on the information on the domains stored in the setting storage section 240.

The multiplexing section 380 multiplexes the collected synchronization requests for each test module 160. The multiplexing section 380 time-division multiplexes the synchronization requests for each test module 160, and sends the result to the synchronization request transmission section 390. The synchronization request transmission section 390 transmits the synchronization requests multiplexed by the multiplexing section 380, to a corresponding test module 160.

As stated in the above configuration example, the test apparatus 100 collects the synchronization requests transmitted from the plurality of test sections 256 for each domain, distributes the synchronization requests for each test module 160, and transmits the result to each test module 160 respectively. By doing so, the test apparatus 100 synchronizes the operation of the plurality of test sections 256, for each of a plurality of domains constituted by a combination of various test sections 256 according to a test program.

Figure 4:
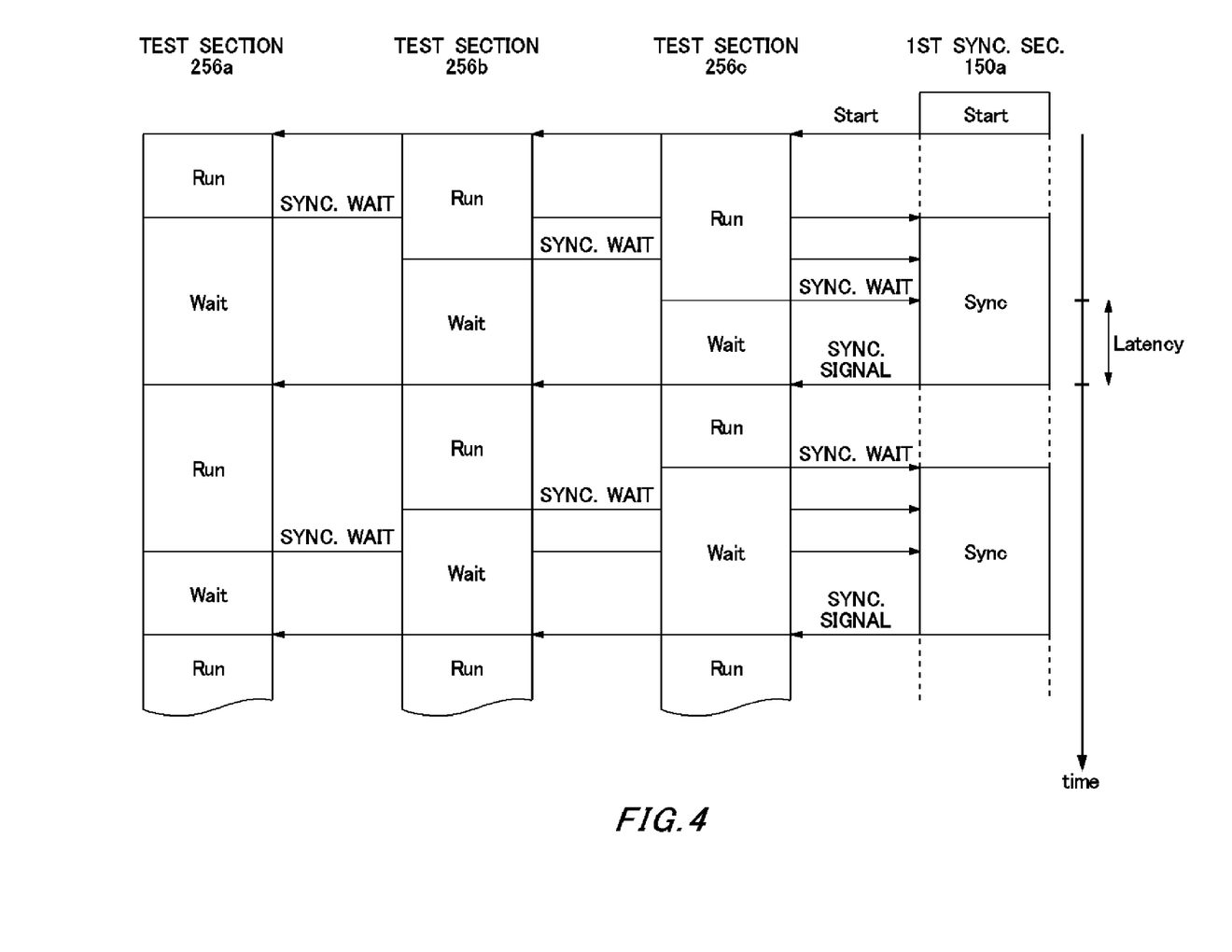
FIG. 4 is a timing chart showing an operation example of a test apparatus 100 according to the present embodiment.

FIG. 4 is a timing chart showing an operation example of the test apparatus 100 according to the present embodiment. In the present example, the operation of a discrete domain including three test sections 256 is synchronized. In a different example, however, the test apparatus 100 may synchronize a different number of test sections 256 as a discrete domain or a domain. In addition, the test apparatus 100 may perform parallel processing with respect to the synchronization of the operation of a plurality of domains.

The test control section 130 designates the test sections 256a, 256b, and 256e as a discrete domain. In this case, the information on this discrete domain may be stored in the setting storage section 240 of the first and the second synchronization sections. Each test control section 130 may store, in advance, a test program and a data pattern to a corresponding test section 256.

The synchronization section 150 supplies the test sections 256 connected thereto, with synchronized start signals (Start) for starting the execution of a test program. Each test section 256 starts execution of a test program in response to the start signal (Run). Each test program may include a plurality of test blocks.

Each test section 256 transitions to a synchronized wait state (Wait) when satisfying a predetermined condition during execution of a test program. For example, each test section 256 transitions to a synchronized wait state (Wait) when the execution of each test block ends. The execution of each test block may end when having obtained from the DUT 10 a result satisfying a predetermined condition.

In this way, when a synchronized wait state (Wait) results during execution of a corresponding test program, a respective test section 256 notifies the synchronization section 150 with a synchronization wait command. It is desirable that each test section 256 transition to a synchronized wait state (Wait) after providing the synchronization section 150 with a synchronized wait command. In addition, each test section 256 starts execution of the next test block (Run), when the synchronized wait state has been cancelled.

The synchronization section 150 detects whether the synchronization wait command has been received from all the predetermined one or more test sections 256, from among the plurality of test sections 256 within a discrete domain. Here, the synchronization section 150 is notified, in advance, about which test section specifically constitutes the predetermined one or more test sections 256. For example, a test block executed by any of the test sections 256 may include an instruction for notifying the synchronization section 150 of the predetermined one or more test sections 256. In the present example, the three test sections 256 are the predetermined one or more test sections 256.

The synchronization section 150 supplies synchronized synchronization signals for canceling the synchronized wait state to the predetermined two or more test sections 256, from among the plurality of test sections 256, on condition that all the test sections 256 have received a synchronized wait state. Here, the synchronization section 150 is notified, in advance, about which test section specifically constitutes the predetermined two or more test sections 256. For example, a test block executed by any of the test sections 256 may include an instruction for notifying the synchronization section 150 of the predetermined two or more test sections 256. In the present example, the three test sections 256 are the predetermined two or more test sections 256.

The first synchronization section 150a supplies the test section 256a and the test section 256b with a start signal for starting execution of a test program. Likewise, the second synchronization section 150b supplies the test section 256e with a synchronized start signal (Start) for starting execution of a test program. In one example of the drawing, the test section 256a first ends execution of a test block, before transitioning to a synchronized wait state (Wait). The test section 256a notifies the first synchronization section 150a with a synchronization request.

Next, the test section 256b ends execution of a test block and transitions to a synchronized wait state (Wait), and then provides the first synchronization section 150a with a synchronization request. Next, the test section 256c ends execution of a test block and transitions to a synchronized wait state (Wait), and then provides the second synchronization section 150b with a synchronization request. The first synchronization section 150a transmits, to the second synchronization section 150b, a result of collecting the synchronization requests for the test section 256a and of the test section 256b. The second synchronization section 150b transmits, to the first synchronization section 150a, a synchronization request for the test section 256e.

The first synchronization section 150a collects the result of collecting the synchronization requests for the test section 256a and of the test section 256b, and the synchronization request for the test section 256e transmitted from the second synchronization section 150b. In the example of the drawing, the computation used in the collection may be the AND condition, and the first synchronization section 150a transmits, to the test section 256a and to the test section 256b, the result of collecting the synchronization requests for the test section 256a, the test section 256b, and the test section 256c.

Likewise, the second synchronization section 150b collects the result of collecting the synchronization request for the test section 256e, and the result of collecting the synchronization requests for the test section 256a and the test section 256b transmitted from the first synchronization section 150a. The second synchronization section 150b transmits, to the test section 256e, the result of collecting the synchronization requests for the test section 256a, the test section 256b, and the test section 256c.

The test section 256a, the test section 256b, and the test section 256c starts execution of the next test program (Run), in response to reception of the result of collecting the synchronization requests from the synchronization section 150a or from the synchronization section 150b. In this way, the synchronization section 150 in the present example supplies synchronized synchronization signals to all the test sections 256, on condition that the synchronization requests have been received from all the test sections 256 within the discrete domain.

In this way, after a predetermined time period (Latency) has passed after reception of the last notified synchronization request, the synchronized synchronization signals are supplied to the three test sections 256. The time period (Latency) is desirably constant regardless of the number of test sections 256 to transmit a synchronization-wait command to the synchronization section 150. Each test section 256, having received a synchronized synchronization signal, starts execution of the next test block in synchronization.

By repeating the stated control, each test section 256 can start synchronized execution of a respective test block. Note that the contents and the execution time of the test block being the target of synchronized execution may be different for each test section 256. For example, the test block being the target of synchronized execution by each test section 256 may have an instruction group in a configuration different from one another, or have an instruction group including instructions in a number different from one another. Since the test apparatus 100 in the present example can synchronize the operation of each test section 256 during execution of a test program, the operation of each test section 256 can be easily synchronized for each test block, even if each test section 256 executes a test block whose execution time is different from one another.

Figure 5:
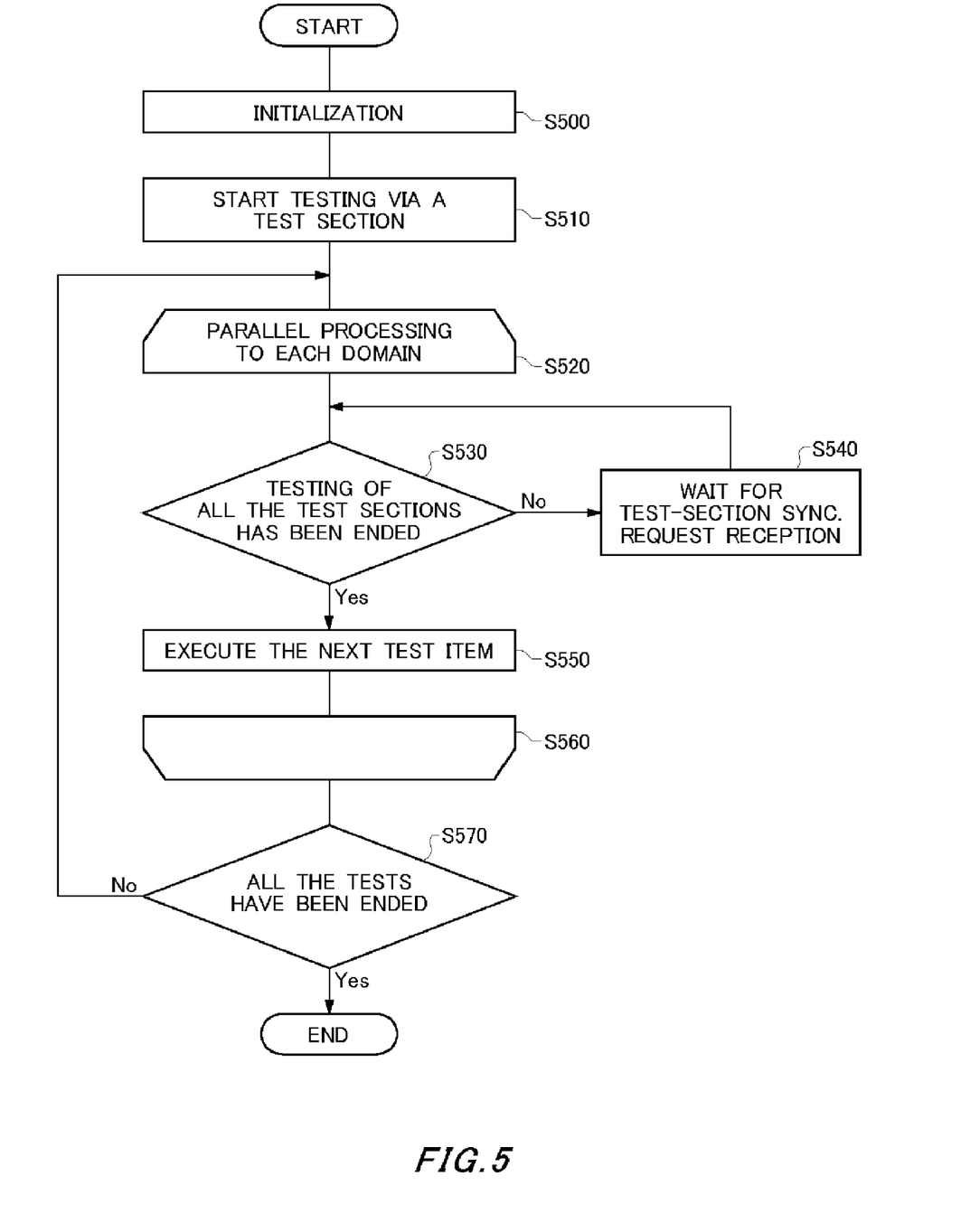
FIG. 5 shows an operation flow of a test apparatus 100 according to the present embodiment.

FIG. 5 shows an operation flow of a test apparatus 100 according to the present embodiment. The test apparatus 100 initializes a parameter used for a test and the like (S500). For example, the test apparatus 100 may set the information of a domain and a discrete domain according to a test program. The test apparatus 100 may also set the computation contents of the local computation section 340 and the global computation section 360 according to a test program. The test apparatus 100 may also set the selection conditions of the domain selection section 330, the exchange signal selection section 350, and the segment selection section 370, based on the configuration of the test section 256 included in the domain or the discrete domain.

The test apparatus 100 starts a test via the test section 256 (S510). The test control section 130 may execute a test, in a unit of a domain, according to a test program. In this case, the test apparatus 100 may execute a test by each domain either successively or in parallel. Steps S520-S560 indicate to execute parallel processing to each domain. If successive processing is executed, Steps S520-S560 are loop processing for each domain.

In the example of the drawing, all the computations of the local computation section 340 and the global computation section 360 are explained as AND. That is, the synchronization section 150 of the present example starts the synchronization operation of the next test execution, in response to ending of test execution for all the test sections 256 constituting a domain. Therefore, the synchronization section 150 judges whether all the synchronization requests for all the test sections 256 included in each domain have been received or not (S530). The synchronization section 150 repeats Step S540 (reception wait) and Step S530 (reception confirm) until all the synchronization requests for the test sections 256 have been received.

When notified of the synchronization requests for all the test sections 256 included in a domain, the synchronization section 150 causes to perform the next test item if there is the next test item in the same domain (S550). The test control section 130 confirms ending of all the tests when the test for each domain has been ended (S570). The test control section 130 continues testing by repeating Steps S520 through S560 if there is a different test item based on a test program. Here, the test control section 130 may execute testing by reconfiguring the domain according to the test program.

When the test apparatus 100 conducts a test using a plurality of test control sections 130, test execution by each test control section 130 may be in parallel. In case where execution of tests of the same test section 256 overlaps, successive processing may be adopted. In this case, whether to perform parallel processing or successive processing may be judged based on whether the same test apparatus 256 is set to a plurality of domains, according to configuration information on a domain or a discrete domain. The test apparatus 100 may end testing in response to ending of all the test execution by the test control section 130.

The test apparatus 100 according to the above-described embodiment may synchronize execution of a plurality of tests by a plurality of test sections 256 for each domain, by configuring them in the unit of a domain. In addition, it is possible to synchronize a plurality of number of times during execution of one test program. In addition, the test apparatus 100 may set a plurality of domains according to a test program using one or more of a plurality of test sections 256 connected to a plurality of synchronization sections 150. In this case, the test apparatus 100 may set a discrete domain including test sections 256 connected to different synchronization sections, to realize synchronized execution of test operations in a discrete domain.

Figure 6:
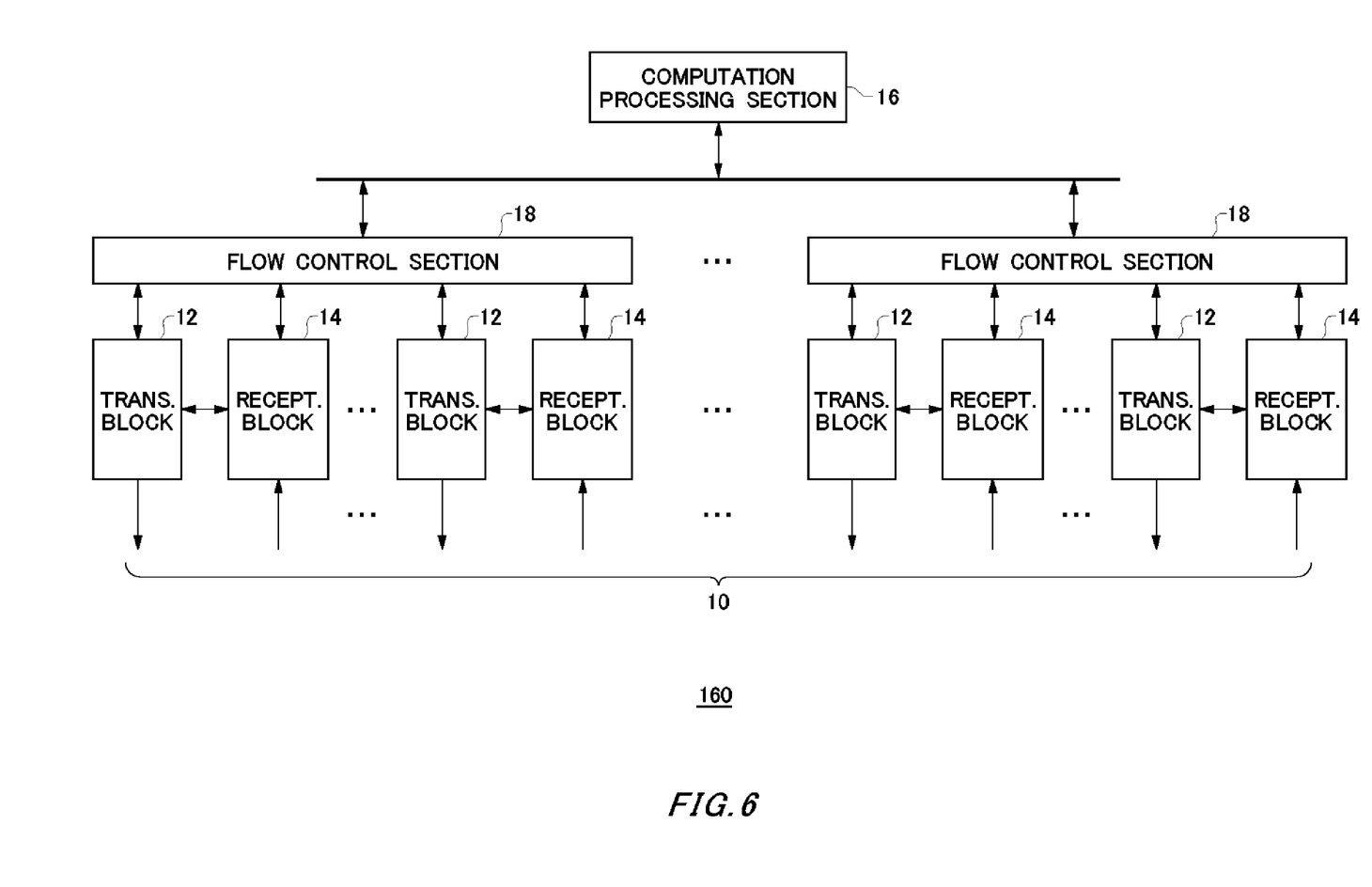
FIG. 6 shows an exemplary configuration of a test module 160 according to the present embodiment.

FIG. 6 shows an exemplary configuration of a test module 160 according to the present embodiment. The test module 160 communicates a packet with a DUT 10 according to a test program, to test the DUT 10.

For example, the test module 160 includes a plurality of transmission blocks 12, a plurality of reception blocks 14, a computation processing section 16, and a plurality of flow control sections 18. In the present example, the test module 160 includes 128 transmission blocks 12, 128 reception blocks 14, one computation processing section 16, and 8 flow control sections 18.

Each of the plurality of transmission blocks 12 and each of the plurality of reception blocks 14 are connected to any of the terminals of the DUT 10. Each of the plurality of transmission blocks 12 is corresponded with a corresponding one reception block 14. Each of the transmission blocks 12 and the reception blocks 14 corresponded with each other is corresponded with any of the plurality of flow control sections 18. In the present example, each of 8 flow control sections 18 is corresponded with 8 transmission blocks 12 and 8 reception blocks 14 corresponded with each other.

A pair of a transmission block 12 and a reception block 14 stores a plurality of packet lists including a series of packets communicated with the DUT 10. A pair of a transmission block 12 and a reception block 14 sequentially communicates, with the DUT 10, a series of packets included in the packet list designated by a corresponding flow control section 18.

The computation processing section 16 processes an arithmetic expression included in a test program. For example, the computation processing section 16 receives an argument of the arithmetic expression from each of a plurality of flow control sections 18, computes the arithmetic expression based on the received argument, and supplies the flow control section 18 with the computation results.

The flow control section 18 designates the order of the packet lists to be executed for each of the corresponded transmission blocks 12 and the reception blocks 14, based on the execution flow of a test program. For example, the flow control section 18 executes a division instruction and a subroutine calling instruction or the like in a test program, and designates a packet list to be executed next with respect to the corresponding transmission block 12 and reception block 14, according to the result of executing these instructions.

For example, the flow control section 18 receives a result of communication with the DUT 10, from the corresponding transmission block 12 and reception block 14, and transfers the received communication result to the computation processing section 16 as an argument of an arithmetic expression. In addition, the flow control section 18 receives the computation result of an arithmetic expression from the computation processing section 16, and designates a packet list to be executed next with respect to the corresponding transmission block 12 and reception block 14.

The test apparatus 100 stated above causes the superior computation processing section 16 to execute an arithmetic expression in a test program, and causes the flow control section 18, the transmission block 12, and the reception block 14 at the subordinate level to control the flow. By doing so, the test apparatus 100 can constitute the superior computation processing section 16 by a processor with high operation capability to realize centralized management of variables, and constitute the flow control section 18, the transmission block 12, and the reception block 14 at the subordinate level by a processor or a sequencer having a high operation frequency, thereby constructing a highly efficient system as a whole.

In addition, when communicating a same packet with a DUT 10 a plurality of number of times, the test apparatus 100 can generate a data sequence by designating common data a plurality of number of times. By doing so, the DUT 10 can reduce the amount of data to be stored therein.

Figure 7:
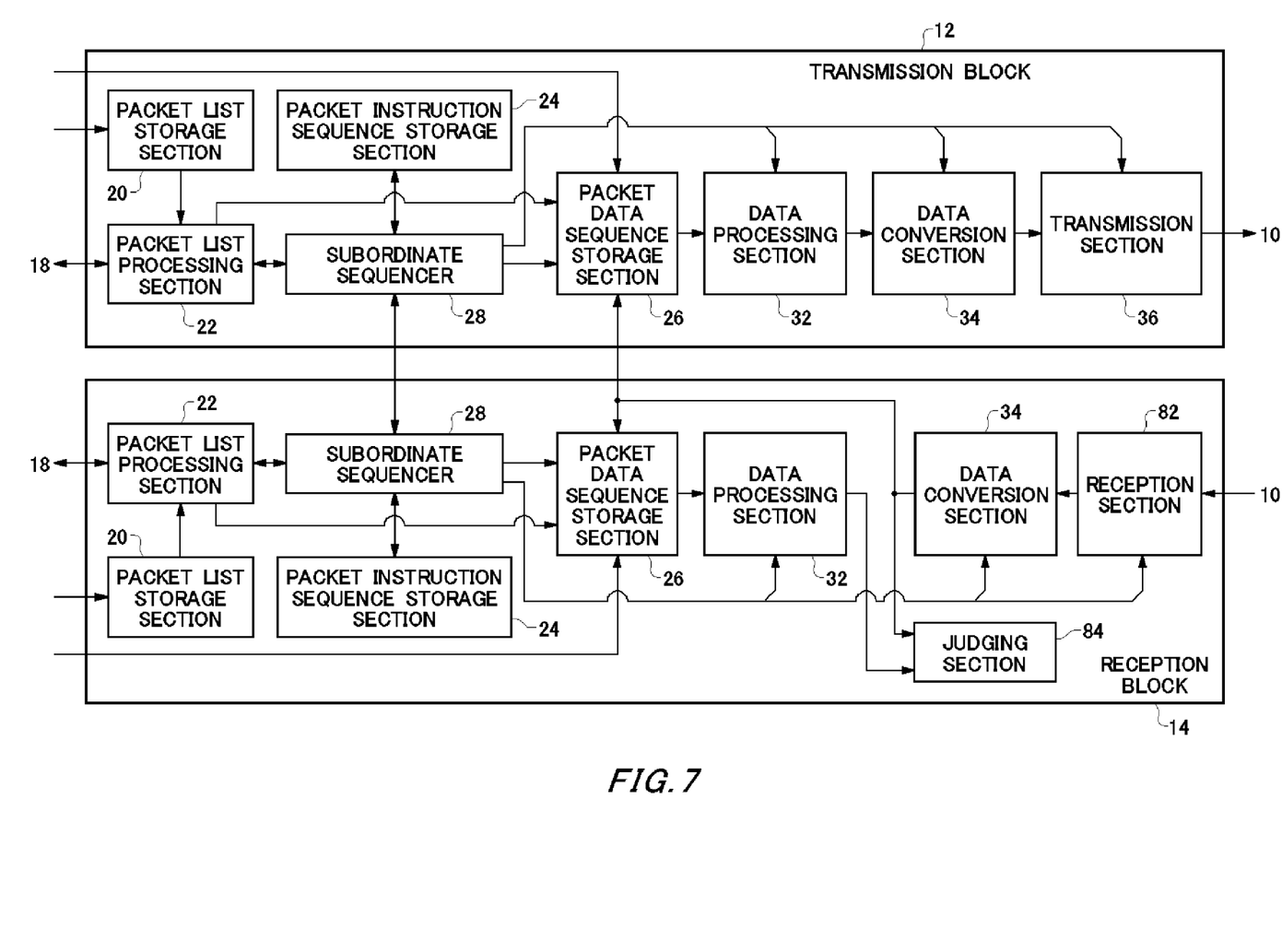
FIG. 7 shows an exemplary configuration of a transmission block 12 and a reception block 14 according to the present embodiment.

FIG. 7 shows an exemplary configuration of a transmission block 12 and a reception block 14 according to the present embodiment. The transmission block 12 transmits, to the DUT 10, packets in the order designated by a packet list. The reception block 14 receives packets from the DUT 10, and compares the packets designated by the packet list to the received packets, thereby judging acceptability of the DUT 10.

First, a transmission block 12 is explained. A transmission block 12 includes a packet list storage section 20, a packet list processing section 22, a packet instruction sequence storage section 24, a packet data sequence storage section 26, a subordinate sequencer 28, a data processing section 32, a data conversion section 34, and a transmission section 36. The packet list storage section 20 stores a supplied plurality of packet lists.

The packet list processing section 22 executes the packet list designated by the flow control section 18, from among the plurality of packet lists stored in the packet list storage section 20, and sequentially designates each packet to be communicated with the DUT 10. For example, the packet list processing section 22 executes a packet list from the address received from the flow control section 18, and sequentially designates the packets to be transmitted to the DUT 10.

For example, the packet list processing section 22 designates the address on the packet instruction sequence storage section 24 storing the instruction sequence for generating the designated packet. Furthermore, for a packet to be communicated with the DUT 10, the packet list processing section 22 designates the address of the data sequence (e.g. the top address of the data sequence) included in the packet in the packet data sequence storage section 26, for example.

In this way, the packet list processing section 22 designates the address of the instruction sequence for generating a packet and the address of the data sequence included in the packet, independently from each other. In this case, if, in a packet list, a common instruction sequence or a common data sequence is designated to two or more packets, the packet list processing section 22 may designate the address of the same instruction sequence or the address of the same data sequence, to the two or more packets.

The packet instruction sequence storage section 24 stores, for each type of packet, an instruction sequence for generating each of a plurality of types of packets. For example, the packet instruction sequence storage section 24 stores an instruction sequence for generating a write packet, an instruction sequence for generating a read packet, and an instruction sequence for generating an idle packet.

The packet data sequence storage section 26 stores, for each type of packet, a data sequence included in each of a plurality of types of packets. For example, the packet data sequence storage section 26 may include a data sequence included in a write packet, a data sequence included in a read packet, and a data sequence included in an idle packet. In addition, the packet data sequence storage section 26 may store individual data modified for each packet and common data common to each type of packet to separate storage regions from each other, for example.

Furthermore, the transmission-side packet data sequence storage section 26 receives reception data included in a packet received by the reception section 82 within the reception block 14 from the data conversion section 34 within the reception block 14. Then, the transmission-side packet data sequence storage section 26 stores reception data included in the packet received by the reception section 82 within the reception block 14.

The subordinate sequencer 28 reads, from the packet instruction sequence storage section 24, the packet instruction sequence designated by the packet list processing section 22 (i.e., the instruction sequence whose address is designated by the packet list processing section 22), and sequentially executes each instruction included in the read instruction sequence. Furthermore, the subordinate sequencer 28 causes the data sequence of the packet designated by the packet list processing section 22 (i.e. the data sequence whose address is designated by the packet list processing section 22) to be sequentially outputted from the packet data sequence storage section 26 as the instruction sequence is executed, to generate the test data sequence used for testing the DUT 10.

In addition, the subordinate sequencer 28, for each time an instruction is executed, supplies control data instructing to provide the read individual data and common data with designated processing (computation or data conversion), to the data processing section 32 and the data conversion section 34. By doing so, the subordinate sequencer 28 is able to cause the designated data portion of the packet designated by the packet list processing section 22, to be equal to the read data provided with the designated processing.

In addition, the subordinate sequencer 28 supplies the packet list processing section 22 with an ending notification in response to completion of the execution of the instruction sequence of the packet designated by the packet list processing section 22. By doing so, the packet list processing section 22 is able to sequentially designate packets as the subordinate sequencer 28 executes the instruction sequence.

In addition, the transmission-side subordinate sequencer 28 in the transmission block 12 designates, to the transmission section 36, the edge timing of the signal transmitted to the DUT 10. The subordinate sequencer 28 controls the edge timing for each packet, by supplying the transmission section 36 with a timing signal, for example.

In addition, the transmission-side subordinate sequencer 28 communicates with the reception-side subordinate sequencer 28 included in the reception block 14. By doing so, the transmission-side subordinate sequencer 28 performs handshake with the reception-side subordinate sequencer 28, to execute the instruction sequence by synchronizing with the reception-side subordinate sequencer 28.

For example, the transmission-side subordinate sequencer 28 notifies the reception-side subordinate sequencer 28 that the test data sequence of the pre-designated packet has been transmitted to the DUT 10. By dong so, the transmission-side subordinate sequencer 28 is able to prohibit the reception-side subordinate sequencer 28 from judging acceptability of the received data sequence until the notification is received from the transmission-side subordinate sequencer 28.

In response to the reception, from the reception-side subordinate sequencer 28, of the notification that the data sequence that matches the generated test data sequence has been received, the transmission-side subordinate sequencer 28 generates the test data sequence of the pre-designated packet. Accordingly, the transmission-side subordinate sequencer 28 is able to transmit the pre-designated packet to the DUT 10 after reception of the predetermined packet from the DUT 10.

The data processing section 32 reads, from the packet data sequence storage section 26, the data sequence of the packet designated by the packet list processing section 22, and generates the test data sequence used for testing the DUT 10. In this case, the transmission-side data processing section 32 may include, into the test data sequence corresponding to the packet to be transmitted to the DUT 10, the value according to the reception data included in the packet received by the reception section 82 within the reception block 14.

For example, the transmission-side data processing section 32 reads data from the transmission-side packet data sequence storage section 26, and generates a test data sequence by setting the pre-designated portion of the data sequence of the packet transmitted to the DUT 10 to be the value according to the reception data (e.g. the value of the reception data itself or the value resulting from providing the reception data with some processing). The transmission-side data processing section 32 is able to transmit a packet including the value according to the reception data included in the packet received from the DUT 10.

The data conversion section 34 converts the test data sequence outputted from the data processing section 32 at the timing designated by the subordinate sequencer 28. The data conversion section 34 performs 8$b$-10$b$ conversion or the like using the table pre-set to the test data sequence or the like, for example. Furthermore, the data conversion section 34 may scramble the test data sequence, as an example. The data conversion section 34 outputs the converted data sequence.

The transmission section 36 transmits the test data sequence generated by the data conversion section 34, to the DUT 10.

Next, a reception block 14 is explained. A reception block 14 has substantially the same configuration and function as a transmission block 12, and so only the differences from the transmission block 12 are explained for the reception block 14.

A reception block 14 includes a packet list storage section 20, a packet list processing section 22, a packet instruction sequence storage section 24, a packet data sequence storage section 26, a subordinate sequencer 28, a data processing section 32, a data conversion section 34, a reception section 82, and a judging section 84. The reception section 82 receives a data sequence of a packet, from the DUT 10.

The reception-side data conversion section 34 converts the data sequence received by the reception section 82 at the timing designated by the reception-side subordinate sequencer 28. The reception-side data conversion section 34 performs 8b-10b conversion or the like using the table pre-set to the received data sequence or the like, for example. Furthermore, the reception-side data conversion section 34 may descramble the received data sequence, as an example.

The reception-side data conversion section 34 supplies the judging section 84 with the converted data sequence. The reception-side data conversion section 34 may supply the converted data sequence to at least one of the reception-side packet data sequence storage section 26 and the transmission-side packet data sequence storage section 26.

The reception-side packet list processing section 22 executes the packet list designated by the flow control section 18, and sequentially designates the packet expected to be received from the DUT 10. The reception-side data processing section 32 also supplies the judging section 84 with the generated test data sequence.

The reception-side subordinate sequencer 28 causes the reception-side packet data sequence storage section 26 to output the data sequence of the packet expected to be outputted from the DUT 10, as the test data sequence. The reception-side subordinate sequencer 28 also designates, to the reception section 82, the strobe timing for taking in the data value of the signal outputted from the DUT 10.

The judging section 84 receives the test data sequence from the reception-side data processing section 32, as well as receiving the data sequence received from the reception-side data conversion section 34. The judging section 84 judges the acceptability of the communication with the DUT 10, based on the result of comparing the received data sequence with the test data sequence. The judging section 84 includes a logic comparing section for making comparison to see whether the data sequence received by the reception section 82 matches the test data sequence, and a fail memory for storing the comparison result. The judging section 84 may notify the reception-side subordinate sequencer 28 that the data sequence received by the reception section 82 matches the designated data sequence, for example.

The reception-side subordinate sequencer 28 communicates with the transmission-side subordinate sequencer 28. By doing so, the reception-side subordinate sequencer 28 performs handshake with the transmission-side subordinate sequencer 28, to execute the instruction sequence in synchronization with the transmission-side subordinate sequencer 28.

For example, the reception-side subordinate sequencer 28 notifies the transmission-side subordinate sequencer 28 that the data sequence that matches the test data sequence generated by the reception-side subordinate sequencer 28 has been received. Accordingly, in response to the reception, from the reception-side subordinate sequencer 28, of the notification that the data sequence that matches the generated test data sequence has been received, the transmission-side subordinate sequencer 28 can generate the test data sequence of the pre-designated packet.

The reception-side subordinate sequencer 28 prohibits the judging section 84 from judging acceptability of the data sequence received by the reception section 82, until the notification is received, from the transmission-side subordinate sequencer 28, indicating that the test data sequence of the pre-designated packet has been transmitted to the DUT 10. Accordingly, the reception-side subordinate sequencer 28 is able to judge whether a response corresponding to a predetermined packet has been outputted from the DUT 10, after transmission of the predetermined packet to the DUT 10.

The reception-side packet data sequence storage section 26 receives reception data included in a packet received by the reception section 82 from the data conversion section 34 within the reception block 14. Then, the reception-side packet data sequence storage section 26 stores reception data included in the packet received by the reception section 82.

Furthermore, the reception-side data processing section 32 includes, into the test data sequence included in the packet expected to be outputted from the DUT 10, the value according to the reception data included in the packet already received by the reception section 82. For example, the reception-side data processing section 32 reads data from the reception-side packet data sequence storage section 26, and generates a test data sequence by setting the pre-designated portion of the data sequence of the packet expected to be received from the DUT 10 to be the value according to the reception data (e.g. the value of the reception data itself or the value resulting from providing the reception data with some processing).

For example, the reception-side data processing section 32 may include, into the test data sequence included in the second packet to be received from the DUT 10, the value according to the reception data included in the first packet already received by the reception section 82. As a result, the reception-side data processing section 32 is able to judge whether the ID to be included in the next and subsequent packets is correct or not, by referring to the ID or the like included in the packet received from the DUT 10, for example.

As stated above, the test apparatus 100 according to the present embodiment is able to conduct processing to include, into the next and subsequent packets, the value according to the reception data included in the received packet, at a position comparatively near the DUT 10. As a result, the test apparatus 100 is able to exchange responses with the DUT 10 quickly.

In addition, it is desirable that the test apparatus 100 be equipped with a data processing section 32 constituted by an arithmetic processing unit having comparatively high operation frequency. As a result, the test apparatus 100 is able to generate data to be included in the next and subsequent packets, from the data included in the received packet.

Although some aspects of the present invention have been described by way of exemplary embodiments, it should be understood that those skilled in the art might make many changes and substitutions without departing from the spirit and the scope of the present invention which is defined only by the appended claims.

The operations, the processes, the steps, or the like in the apparatus, the system, the program, and the method described in the claims, the specification, and the drawings are not necessarily performed in the described order. The operations, the processes, the steps, or the like can be performed in an arbitrary order, unless the output of the former-described processing is used in the later processing. Even when expressions such as "First," or "Next," or the like are used to explain the operational flow in the claims, the specification, or the drawings, they are intended to facilitate the understanding of the invention, and are never intended to show that the described order is mandatory.

The invention claimed is:

1. A test apparatus for testing at least one device under test, comprising:
 a plurality of test sections that test the at least one device under test via a plurality of terminals; and a first synchronization section and a second synchronization section that, for each of a plurality of domains that respectively include one or more of the plurality of test sections, synchronize the one or more test sections included in the domain, wherein each of the first synchronization section and the second synchronization section includes:

a local collection section that collects, for each domain, synchronization requests from test sections from among the plurality of test sections connected to the corresponding synchronization section;

an exchange section that exchanges, for a discrete domain of the plurality of domains that includes test sections connected to the first synchronization section and test sections connected to the second synchronization section, synchronization requests collected in the corresponding synchronization section with synchronization requests collected in the other synchronization section;

a global collection section that collects, for the discrete domain, the synchronization requests collected in the corresponding synchronization section and the synchronization requests collected in the other synchronization section; and a distribution section that distributes, to each of the test sections connected to the corresponding synchronization section, synchronization requests collected for a domain including the test section.

2. The test apparatus according to claim 1, wherein each of the first synchronization section and the second synchronization section further includes:

a setting storage section that stores setting of the discrete domain from among two or more domains configurable in the corresponding synchronization section, and the exchange section selects, from among the synchronization requests collected in the corresponding synchronization section, synchronization requests collected for the discrete domain, and transmits the selected synchronization requests to the other synchronization section, and receives, from the other synchronization section, synchronization requests collected for the discrete domain by the other synchronization section.

3. The test apparatus according to claim 2, wherein each of the first synchronization section and the second synchronization section is capable of configuring, as the discrete domain, a part of the two or more domains configurable in the corresponding synchronization section.

4. The test apparatus according to claim 1, wherein the global collection section adjusts a timing of the synchronization requests collected in the corresponding synchronization section and a timing of the synchronization requests collected in the other synchronization section, and collects synchronization requests generated at a same timing from the respective test sections included in the discrete domain at the same timing.

5. The test apparatus according to claim 1, wherein in each of the first synchronization section and the second synchronization section, the local collection section collects synchronization requests of the respective test sections included in a domain using an AND condition or an OR condition depending on a setting, and the global collection section collects the synchronization requests collected in the other synchronization section and the synchronization requests collected in the corresponding synchronization section using an AND condition or an OR condition depending on a setting.

6. The test apparatus according to claim 1, wherein each of the plurality of test sections tests the at least one device under test via at least one of the plurality of terminals, the test apparatus includes a plurality of test modules that mount thereon two or more of the test sections, multiplex synchronization requests from each of the two or more test sections, and transmit the multiplexed synchronization requests, and in each of the first synchronization section and the second synchronization section, the local collection section includes:

a synchronization request reception section that receives a multiplexed synchronization request from a test module from among the plurality of test modules that is connected to the corresponding synchronization section; and a demultiplexing section that demultiplexes the synchronization request multiplexed by the test module, and outputs synchronization requests from respective test sections in the test module, and the distribution section includes:

a multiplexing section that multiplexes collected synchronization requests for each of the test modules; and a synchronization request transmission section that transmits the synchronization requests multiplexed by the multiplexing section, to a corresponding one of the test modules.

7. A test method for testing at least one device under test, comprising:

a plurality of test steps of testing the at least one device under test via a plurality of terminals; and a first synchronization step and a second synchronization step of, for each of a plurality of domains that respectively include one or more of the plurality of test steps, synchronizing the one or more test steps included in the domain, wherein each of the first synchronization step and the second synchronization step includes:

a local collection step of collecting, for each domain, synchronization requests from a test step from among the plurality of test steps included in the corresponding synchronization step;

an exchange step of exchanging, for a discrete domain of the plurality of domains that includes test steps included in the first synchronization step and test steps included in the second synchronization step, synchronization requests collected in the corresponding synchronization step with synchronization requests collected in the other synchronization step;

a global collection step of collecting, for the discrete domain, the synchronization requests collected in the corresponding synchronization step and the synchronization requests collected in the other synchronization step; and a distribution step of distributing, to each of the test steps included in the corresponding synchronization step, synchronization requests collected for a domain including the test step.

* * * * *